(12) United States Patent  
Giuroiu et al.

(10) Patent No.: US 6,982,454 B2  
(45) Date of Patent: Jan. 3, 2006

(54) METAL-METAL CAPACITOR ARRAY

(75) Inventors: Horia Giuroiu, Campbell, CA (US); Sorin Andrei Spanoche, Santa Clara, CA (US)

(73) Assignee: Oki Electric Industry Co., Ltd., Tokyo (JP)

( * ) Notice: Subject to any disclaimer, the term of this patent is extended or adjusted under 35 U.S.C. 154(b) by 28 days.

(21) Appl. No.: 10/690,456

(22) Filed: Oct. 22, 2003

(65) Prior Publication Data

US 2004/0129966 A1    Jul. 8, 2004

Related U.S. Application Data

(60) Provisional application No. 60/421,779, filed on Oct. 29, 2002.

(51) Int. Cl.  
*H01L 27/108* (2006.01)

(52) U.S. Cl. .................. 257/306; 257/307; 257/308

(58) Field of Classification Search ......... 257/306–308  
See application file for complete search history.

(56) References Cited

U.S. PATENT DOCUMENTS 5,838,032 A * 11/1998 Ting ........................ 257/211

* cited by examiner

*Primary Examiner*—Gene M. Munson  
(74) *Attorney, Agent, or Firm*—Volentine Francos & Whitt, PLLC

(57) ABSTRACT

A capacitor includes a semiconductor substrate, a bottom conductive pattern, first to third insulating layers, first to third metal plates and a connecting pattern. The bottom conductive pattern is formed on the semiconductor substrate. The first to third insulating layers are formed on the bottom conductive pattern, the first and second metal plates, respectively. The first metal plate is formed on the first insulating layer within a first area. The first metal plate is electrically connected to the bottom conductive pattern. The second metal plate is formed on the second insulating layer within the first area. The second metal plate has an opening in the center thereof. The third metal plate is formed on the third insulating layer. The connecting pattern is formed through the second and third insulating layers and the opening of the second metal plate. The connecting pattern electrically connects the first and the third metal plate.

23 Claims, 13 Drawing Sheets

METAL-METAL CAPACITOR ARRAY

CROSS-REFERENCE TO RELATED APPLICATIONS

A claim of priority is made to U.S. provisional application Ser. No. 60/421,779, filed Oct. 29, 2002, the entire contents of which are incorporated herein by reference.

BACKGROUND OF THE INVENTION

The present invention relates to the field of integrated circuits that include capacitor arrays, particularly for use in switched-capacitor amplifiers, digital-to-analog converters and analog-to-digital converters.

Arrays of precision capacitors are used in various switched capacitor circuits. One example is illustrated in FIG. 1, where a switched-capacitor DAC using (n+1) capacitors (C, 2C, ..., $2^{n-1}C$, $2^nC$) with a common top plate and separate bottom plates is shown. The use of a similar capacitor array of capacitors ($C_1=C$, $C_2=2C$, ..., $C_{K+1}=2^{K-1}C$) in an ADC is presented in FIG. 2. In both cases, the values of the capacitances are powers of 2 of a unit capacitance. For matching reasons, the capacitor arrays are built from unit capacitors, interconnected as to provide the appropriate values, and distributed in the array as to compensate for the gradients of the dielectric thickness. In the particular cases shown in FIGS. 1 and 2, the top plates of the capacitors of the arrays are common.

The conventional arrays of precision capacitors are usually built using polysilicon-polysilicon structures. The ratio of the capacitances is usually of great importance, and in order to compensate for the thickness gradients in the dielectric layer(s), the capacitors are built using unit cells arranged in a common centroid array. This strategy is illustrated in FIG. 3b, for a 3-bit ADC built using the schematic of FIG. 3a. The capacitors marked 2, 4, 8 are, respectively, belonging to the capacitors $C_2=2*C$, $C_4=4*C$, $C_8=8*C$. The capacitors with a similar marking are connected in parallel. Because in this array structure the top plate is common, only the bottom plates of the similarly marked capacitors are connected together through dedicated lines. One can also see capacitors marked D (dummy), which have no active role in the array. Their presence enhances the matching of the capacitors in the array, by providing similar surroundings to each unit capacitor.

In a digital process, usually there is only one layer of polysilicon available and the precision capacitors are implemented as a sandwiched structure of three metal layers, as shown in FIG. 4. The internal layer 14 is the top plate, while the external layers 16 and 18 are connected together and form the bottom plate of the capacitor. Usually, the connection 17 between the layers forming the bottom plate is made at the periphery of each capacitor.

When the capacitors are arranged in an array with a common top plate, there is a need to connect the various bottom plates in order to form the required capacitor configurations. In a polysilicon-polysilicon capacitor array, the connection between the bottom plates is usually made in one or more of the metal layers, on top of the capacitor structures. For a metal-metal capacitor, the connection is usually made in an extra layer of metal.

When using a metal-metal sandwich structure, the specific capacitance is small and the capacitors occupy a large area of the integrated circuit. Besides the greater level of noise induced into the substrate or collected from the substrate by a big capacitor array, a large percentage of the area is occupied by the connection between the various existing bottom plate layers, thus reducing the useful area allocated to the capacitors and making the layout more difficult.

SUMMARY OF THE INVENTION

In order to increase the useful area occupied by a metal-metal capacitor sandwich, the present invention discloses a preferably symmetrical three metal layers capacitor structure with a connection between the bottom plate layers made in the center of the structure, through an opening in the central layer.

Also provided by the present invention is a method of connecting the capacitors in an array structure, by using uniformly distributed diffusion and/or polysilicon and/or metal lines placed under the capacitor array.

A method of building the capacitor array periphery in such a way as to cancel all systematic unit capacitor mismatch is also described.

The method of building the capacitor structure and the array of capacitors is most useful in single polysilicon CMOS integrated circuits.

DETAILED DESCRIPTION OF THE PREFERRED EMBODIMENTS

Figure 1:
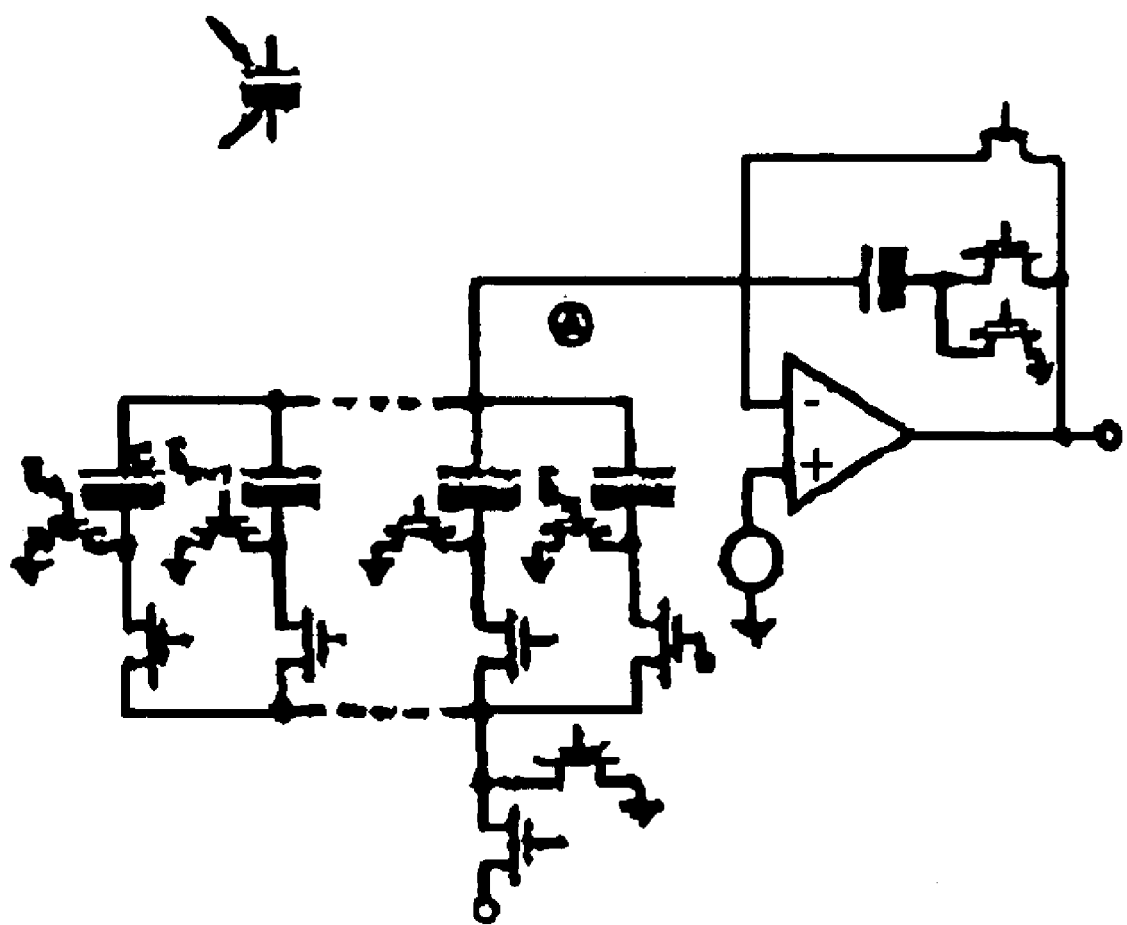
FIG. 1 is a schematic diagram of a switched-capacitor digital-to-analog converter.
Figure 2:
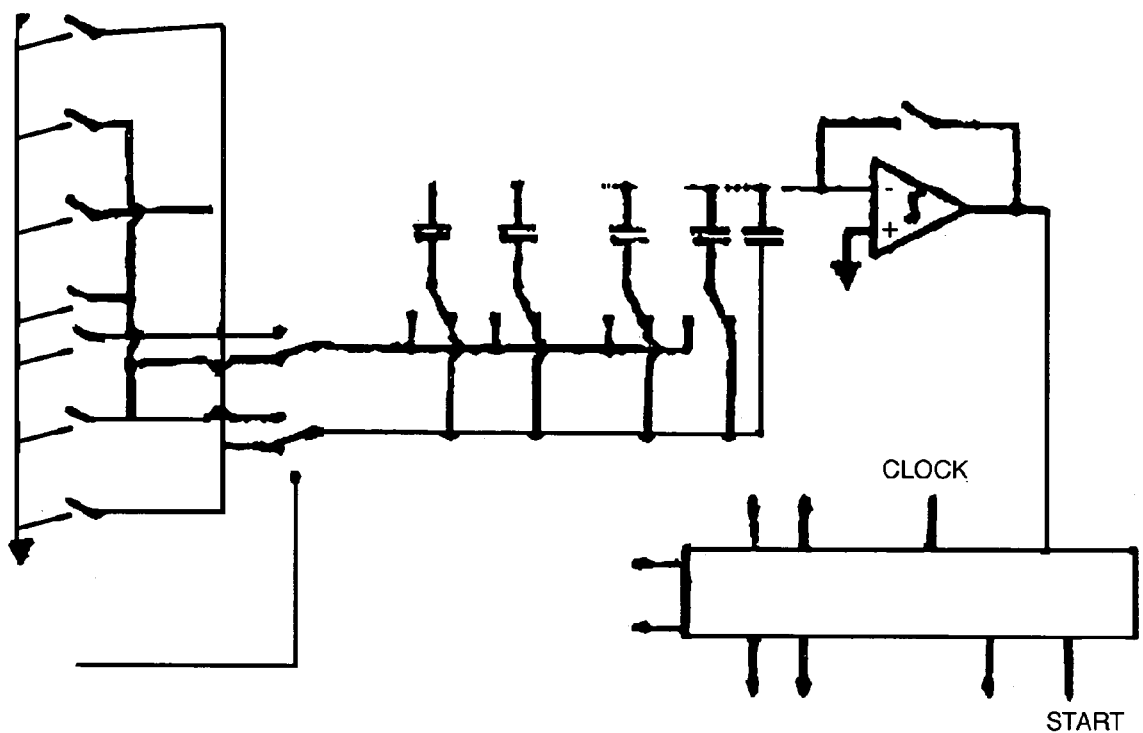
FIG. 2 shows a schematic diagram of a switched-capacitor analog-to-digital converter.
Figure 3A:
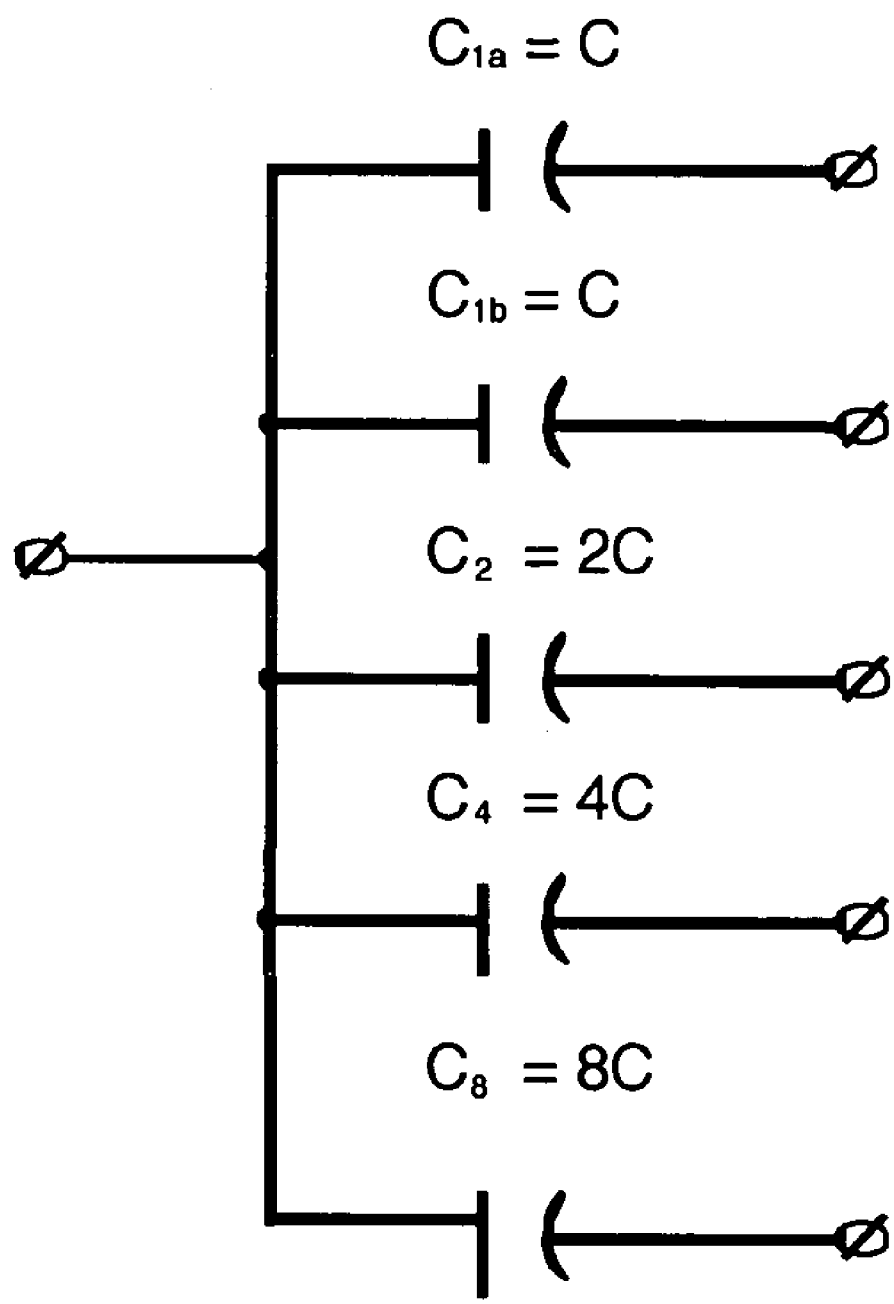
FIG. 3a is the schematic diagram of the capacitor array of a switched-capacitor 3-bit DAC.
Figure 3B:
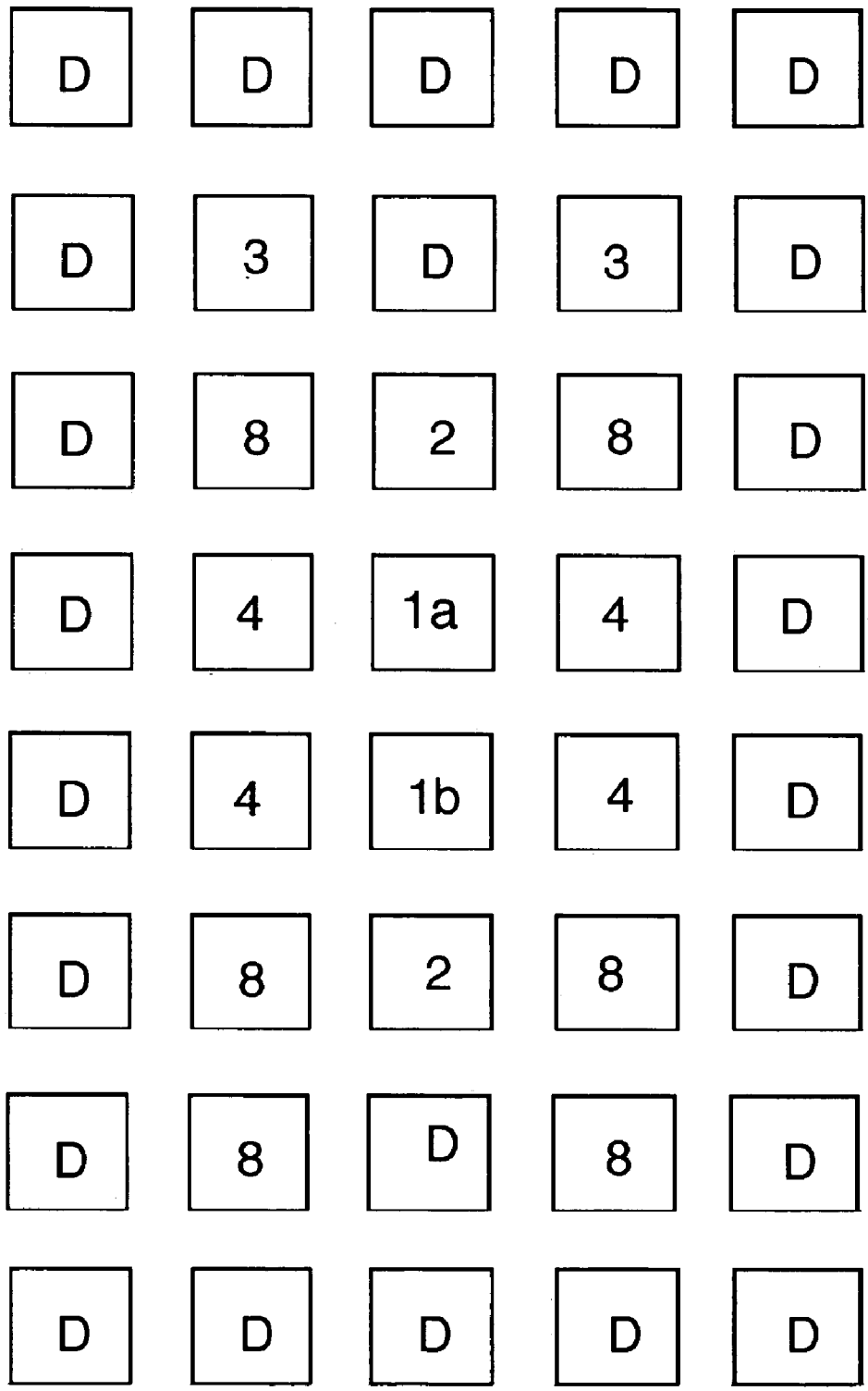
FIG. 3b illustrates a possible common-centroid layout configuration of the DAC presented in FIG. 3a, with the allocation of unit capacitors to the various capacitors.
Figure 4:
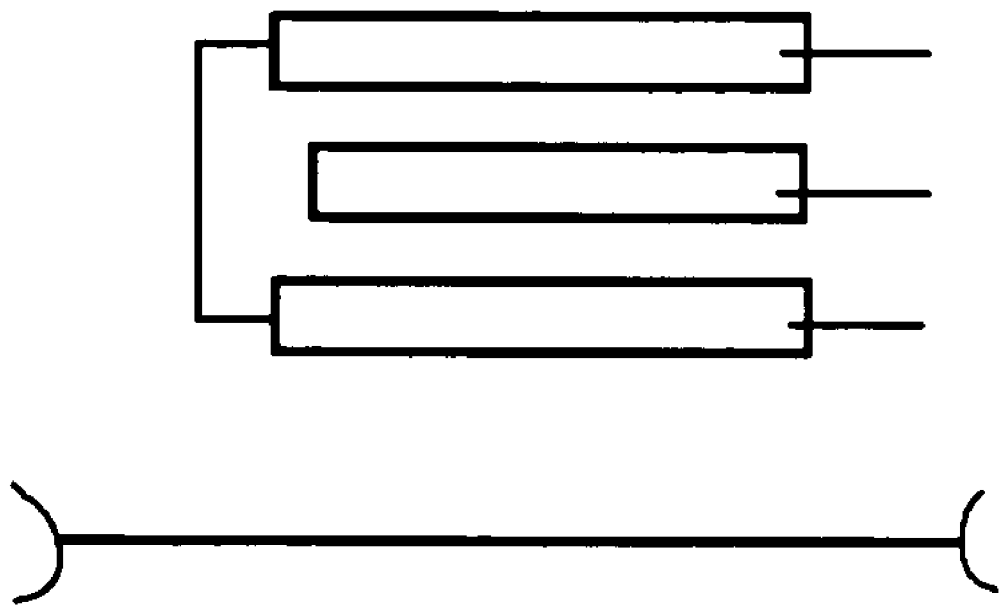
FIG. 4 shows a simplified cross-section of a conventional metal-metal sandwich capacitor structure.
Figure 5:
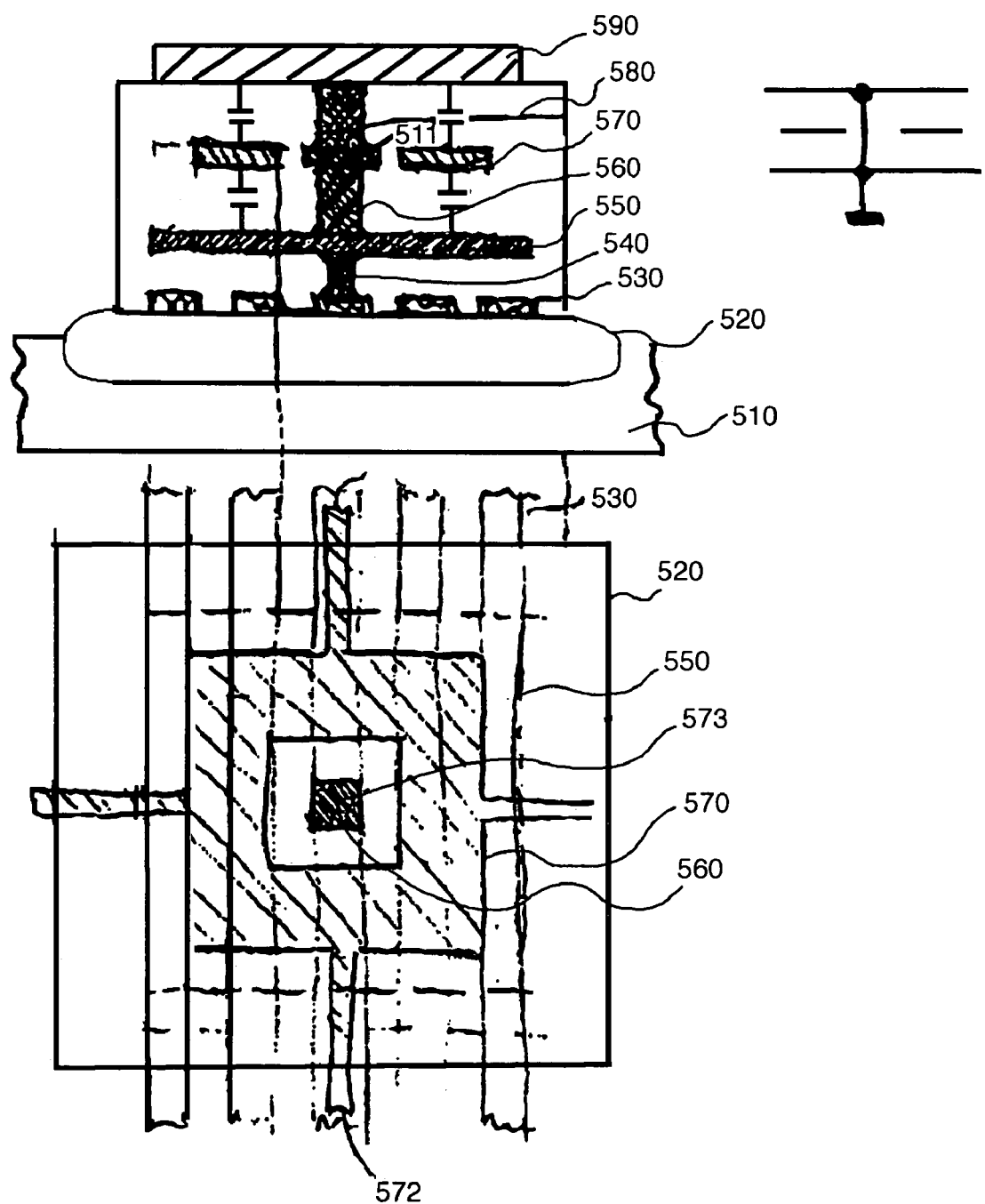
FIG. 5 shows a capacitor fabricated in accordance to the present invention.

The basic capacitor according to this disclosure is shown in FIG. 5. The capacitor is built out of a sandwich of three metal plates, in three different metal layers on an oxide layer 520 formed in substrate 510. Let's assume, for instance, that the metal layers used are Metal1 (M1), Metal2 (M2) and Metal3 (M3).

The capacitor consists of:
- a top plate 570 made of Metal2 and having an opening 573 in the center and conductive branch members 572;
- a first bottom plate 550 made of Metal1;
- a second bottom plate 590 made of Metal3;
- a stack of via 560, Metal2 plate 511 and via 561 connecting the first and the second bottom plates through the 573 opening;
- a contact structure 540 connecting the first bottom plate 550 to a bottom connection 530 placed between the first metal plate and the substrate.

The bottom connection can be made of polysilicon, metal or a diffused layer into the substrate.

The capacitor plates, made of metal, can be implemented in any three layers of metal. For the sake of the highest specific capacitance, these three layers have to be consecutive, for instance Metal1, Metal2, Metal3, or Metal2, Metal3, Metal4, but the capacitor can be easily implemented in other metal layers, like Metal2, Metal4 and Metal5.

In case the capacitor is implemented in Metal1, Metal2 and Metal3, the bottom interconnection can be made of polysilicon or of a diffused layer. If the capacitor is implemented in higher layers of metal, then the bottom connection can be made of polysilicon, diffused layer or metal.

A regular way of implementing a metal sandwich capacitor uses metal shields around the top layer, thus increasing the overall capacitor area for a given capacitance. Per direction, the extra area is associated with two stacks of vias and metal and the associated clearing spaces in the top plate layer. The capacitor of FIG. 5 allows a better use of the silicon area, by using only one stack of vias and metal per direction.

Figures 6A, 6B, 6C, 6D:
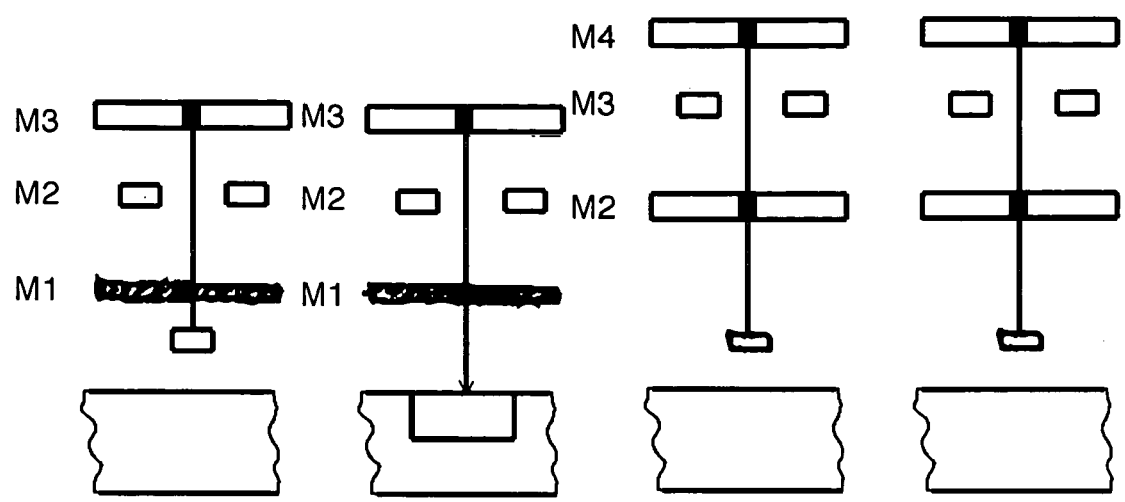
FIG. 6a shows a simplified cross-section of a Metal1-Metal2-Metal3 sandwich capacitor structure with polysilicon bottom interconnection, built in accordance to the present invention.
FIG. 6b shows a simplified cross-section of a Metal1-Metal2-Metal3 sandwich capacitor structure with diffused bottom interconnection, built in accordance to the present invention.
FIG. 6c shows a simplified cross-section of a Metal2-Metal3-Metal4 sandwich capacitor structure with polysilicon bottom interconnection, built in accordance to the present invention.
FIG. 6d shows a simplified cross-section of a Metal2-Metal3-Metal4 sandwich capacitor structure with Metal1 and polysilicon bottom interconnections, built in accordance to the present invention.

Usually, several lines of bottom interconnection can be placed under the capacitor structure, allowing the allocation of various unit capacitors to a main capacitor. As an example, this is shown in FIG. 5 as five 530 lines. Several combinations of metal layers and bottom interconnection layers are shown in a simplified manner in FIGS. 6a, b, c, and d. FIG. 6a shows a capacitor built in M1, M2, M3, with bottom interconnection made of polysilicon. In FIG. 6b there is a M1-M2-M3 capacitor with bottom interconnections made of an n+ diffusion into a p-substrate. FIG. 6c shows a M2-M3-M4 capacitor with polysilicon bottom interconnection. FIG. 6d shows a M2-M3-M4 capacitor with M1 bottom interconnection and an extra interconnection layer in polysilicon, thus allowing more complex bidimensional connections between the bottom plates of the capacitors.

Figure 7:
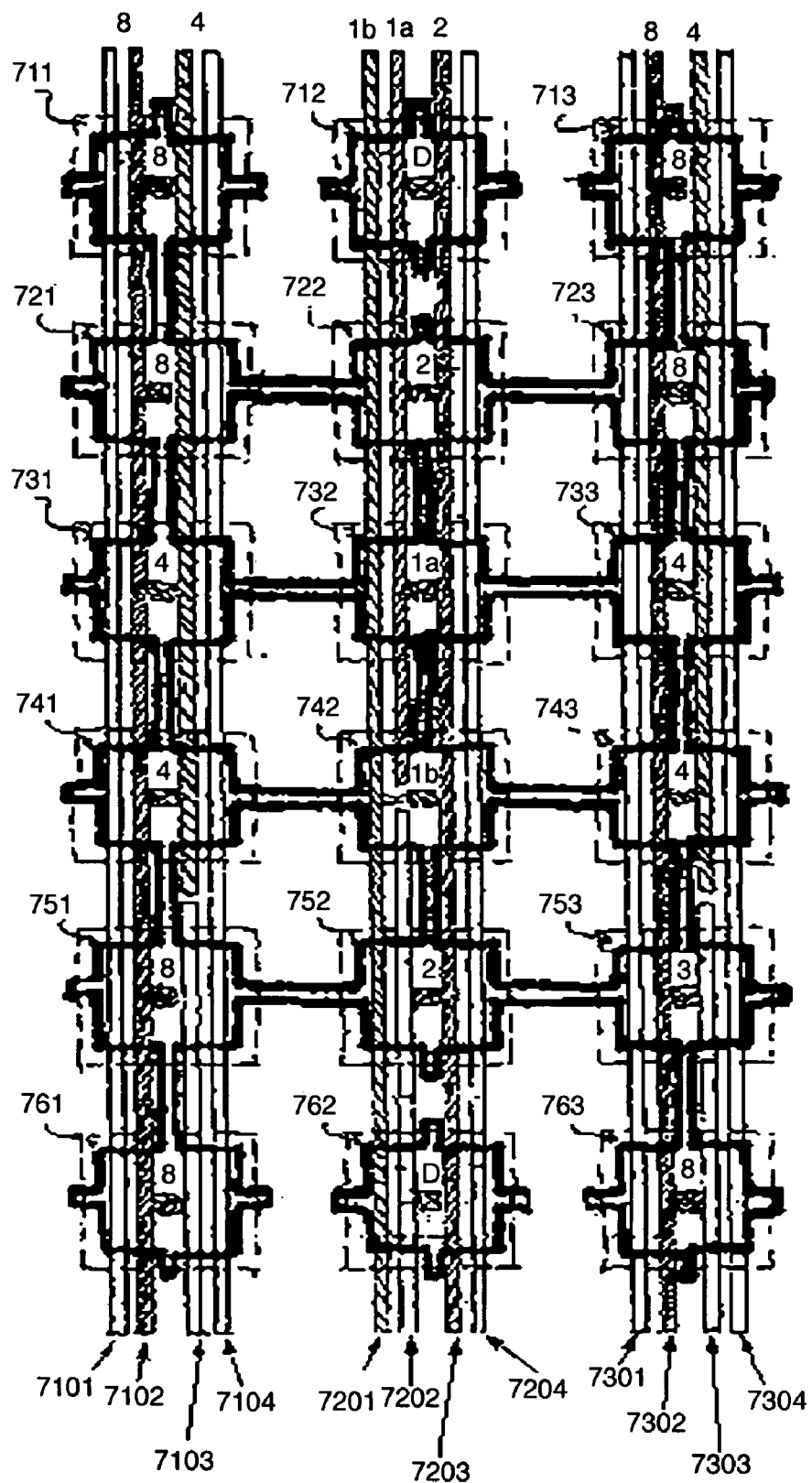
FIG. 7 shows a capacitor array with interconnections for a 3-bit DAC, built according to the present invention.

FIG. 7 shows an example of using the capacitors of FIG. 5 in an array built according to this invention, with bottom interconnections and common top plate. The array of capacitors includes the capacitors 711, 712, 713, 721, 722, 723, 731, 732, 733, 741, 742, 743, 751, 752, 753, 761, 762, 763 of identical structure and size. As an example, the capacitors can be built with Metal1, Metal2 and Metal3 plates, with bottom interconnections made of polysilicon. The capacitors are arranged in a 6 rows by 3 columns matrix. There are 1+1+2+4+8=16 active capacitors and two dummy capacitors (712 and 762). Each column of capacitors has four bottom interconnection lines: 7101, 7102, 7103, 7104 for the 711, 721, . . . , 761 capacitors; 7201, 7202, 7203, 7204 for the 712, 722, . . . , 762 capacitors; 7301, 7302, 7303, 7304 for the 713, 723, . . . ,763 capacitors. The unit capacitors allocation is as following:
- to the C8 capacitor: 711, 721, 751, 761, 713, 723, 753, 763;
- to the C4 capacitor: 731, 741, 733, 743;
- to the C2 capacitor: 722, 752;
- to the C1a capacitor: 732;
- to the C1b capacitor: 742.

The multiple-unit capacitors C2, C4, C8 are built in a common-centroid manner.

The bottom plates of the capacitors 711, 721, 751 and 761 belonging to the C8 capacitor are connected through the bottom connection 7103, accessible both from the top and from the bottom of the capacitor array.

The bottom plates of the capacitors 711, 721, 751 and 761 belonging to the C8 capacitor are connected through the bottom connection 7102, accessible both from the top and from the bottom of the capacitor array.

The bottom plates of the capacitors 731, 741 belonging to the C4 capacitor are connected through the bottom connection 7103, accessible from the top of the capacitor array. The bottom line 7103 is broken between the capacitors 741 and 751, allowing the use of the bottom portion for other connections.

The bottom plates of the capacitors 733, 743 belonging to the C4 capacitor are connected through the bottom connection 7303, accessible from the top of the capacitor array. The bottom line 7303 is broken between the capacitors 743 and 753, allowing the use of the bottom portion for other connections.

The bottom plates of the capacitors 722, 752 belonging to the C2 capacitor are connected through the bottom connection 7203, accessible from both the top and the bottom of the capacitor array.

The bottom plate of the capacitor 732 being the only component of the C1a capacitor is connected through the bottom connection 7202, accessible from the top of the capacitor array. The bottom line 7202 is broken under the capacitor 742, allowing the use of the bottom portion for other connections.

The bottom plate of the capacitor 742 being the only component of the C1b capacitor is connected through the bottom connection 7201, accessible from both the top and the bottom of the capacitor array.

The bottom lines corresponding to unit capacitors belonging to the same capacitor can be connected outside the main capacitor array. The common top plate can also be connected outside the main capacitor array.

For certain configurations, it is possible to have capacitors in the array with different top plate connections.

The capacitors 712 and 762 do not belong to the 3-bit DAC, but their presence does improve the matching of the active capacitors. In order for the active capacitors to see the same surroundings, dummy capacitors can be added to the array, following well established layout techniques.

Figure 8:
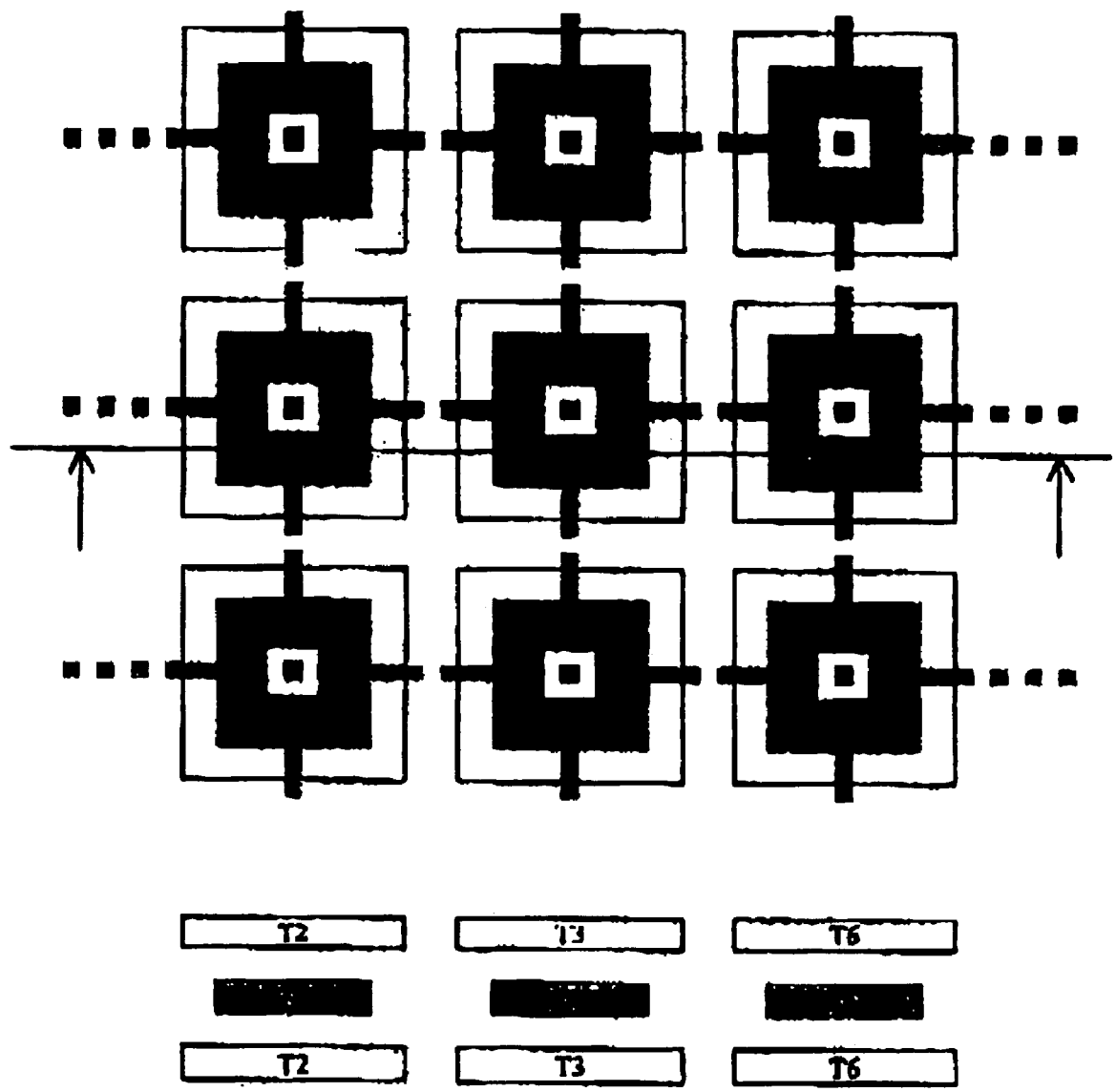
FIG. 8 shows the internal portion of an array of capacitors fabricated in accordance to the present invention and a cross section of this structure.

FIG. 8 shows the internal portion of an array of capacitors fabricated in accordance to the present invention and a cross section of this structure. The middle layer terminal of each capacitor (top capacitor plate) is separated and is denoted in gray. The black center square of each unit capacitor represents the contact between the top and the bottom conductive layers that form the bottom capacitor plate. The whole array is equivalent to a multi-terminal capacitor due to the fact that the unit capacitors are close to each other and the electrical field of one can influence the charges on the neighboring capacitors. The cross section from FIG. 8 shows the different terminals of this multi-terminal capacitor. If one grounds all terminals except T4, the total capacitance of T4 will be the sum of the different mutual capacitances. If we take into consideration a bi-dimensional case and neglect the capacitances related to other terminals except the ones presented in the cross section then:

$$C_3 = C_{30} + C_{31} + C_{32} + C_{34} + C_{35} + C_{36}$$

Where:

$C_{30}$ is the parasitic capacitance of terminal T4 to ground, $C_{mn}$ is the capacitance between terminal TM and TN where M=1,6 and N=1,6.

Due to the symmetry of the capacitor $C_{31}=C_{35}$ and $C_{32}=C_{36}$, $C_{34}$ is the useful capacitance, $C_{30}$ is the main bottom plate capacitance and all other capacitances are related to the neighboring unit capacitors. Let's define $C_u=C_{34}$, $C_b=C_{30}$, $C_{nbt}=C_{31}$ and $C_{ntt}=C_{32}$.

Figure 9:
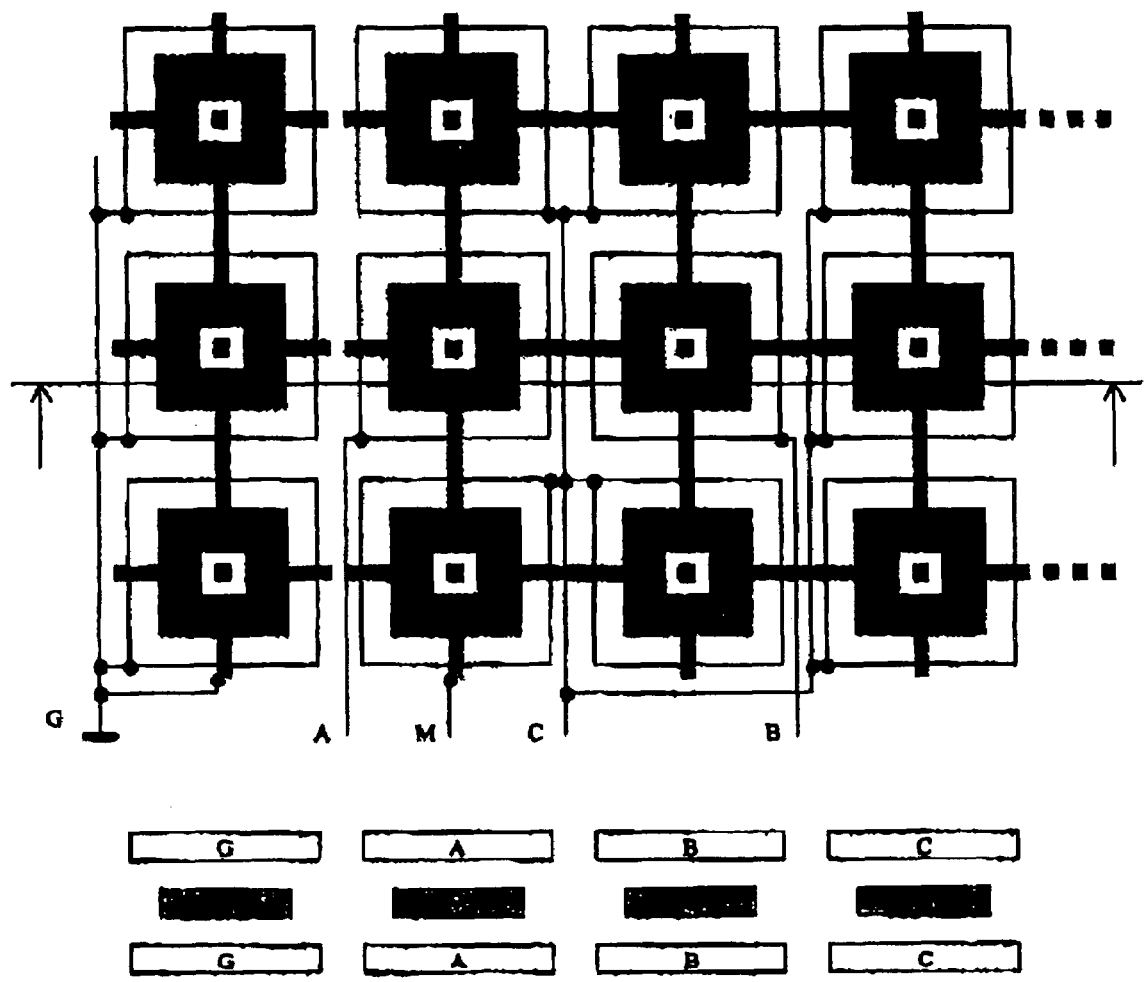
FIG. 9 shows the traditional way of connecting dummy capacitors at the periphery of a capacitor array and a cross section of the structure. The unit capacitors are built in accordance to the present invention.

The usual way to build a well-balanced and matched array of capacitors is to place at the periphery a border of dummy devices that will compensate for non-uniform etching and other neighboring-related non-idealities. FIG. 9 shows the traditional way of connecting dummy capacitors at the periphery of a capacitor array. The unit capacitors are built in accordance to the present invention. The whole dummy capacitor border is connected to a terminal denoted G in FIG. 9. This is usually ground but can be used by the designer as an extra terminal of the capacitor array. All non-dummy unit capacitors have a common top terminal (denoted M in FIG. 9). If we use the cross section from FIG. 9 and use a bi-dimensional approximation, we can calculate the capacitance between A and M and between B and M:

$$C_{AM} = C_u + C_{nbt} \text{ and } C_{BM} = C_u + 2 \times C_{nbt}$$

Where $C_u$ and $C_{nbt}$ were defined above.

This shows that the two capacitances $C_{AM}$ and $C_{BM}$ are not well matched due to the dummy capacitor tied to G.

Figure 10:
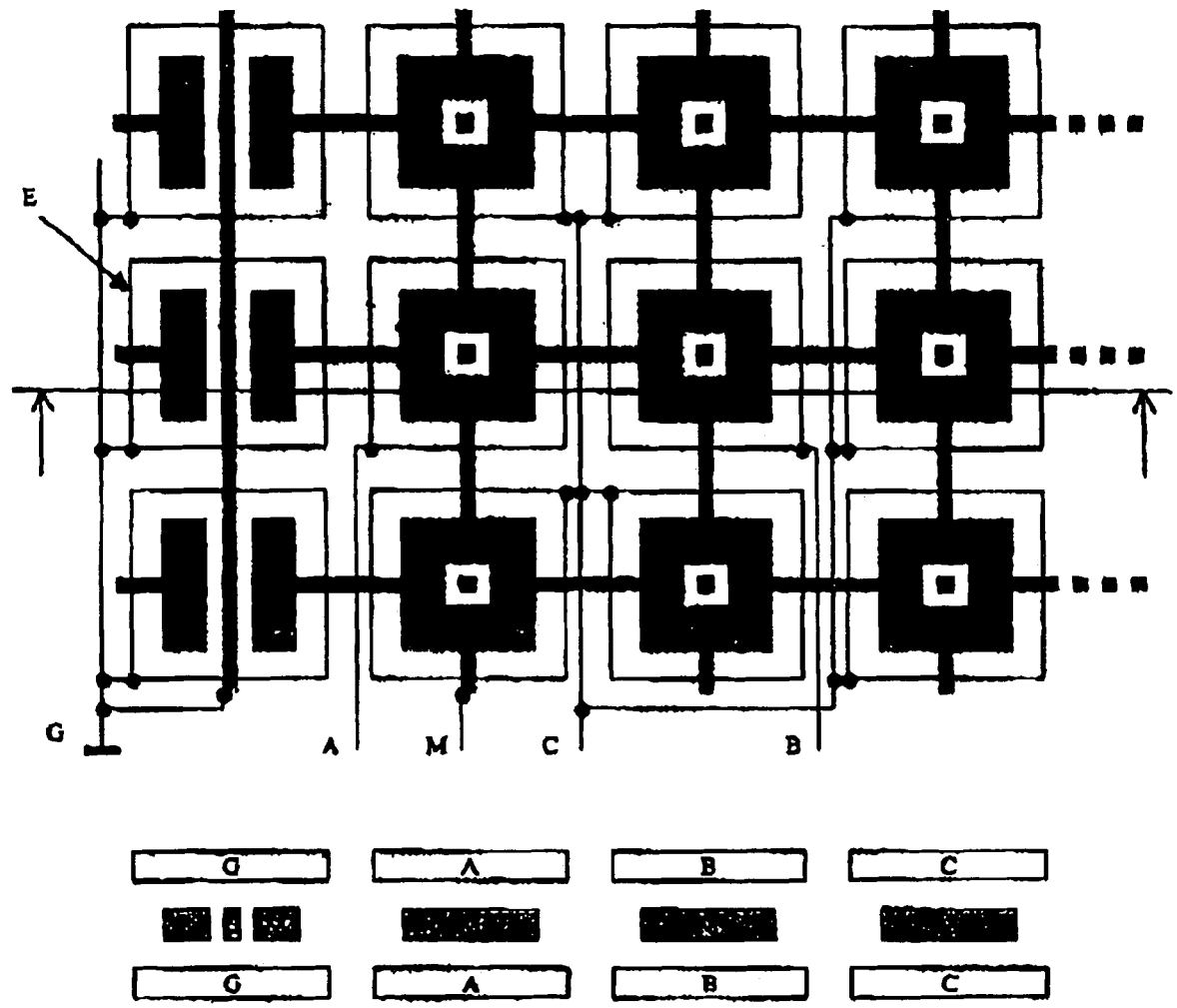
FIG. 10 presents the preferred embodiment of the periphery dummy capacitors and a cross section of the structure.

FIG. 10 shows a possible solution to match the two array capacitances. The new dummy edge capacitor denoted E in FIG. 10 has three conductive regions defined in the middle layer (the one used for the top unit capacitor terminal). The right-most region denoted M is tied to the common terminal of the capacitor array denoted also M. The middle region is tied to terminal G (usually ground). The left-most region (denoted F) can be left floating or tied to other terminal or even to ground. This part plays no electrical role. In the case in which matching due to non-uniform etching or other neighboring-related effects is good enough, this left part of the dummy edge capacitor can be even omitted.

In this case, by analyzing the cross section we obtain:

$$C_{AM} = C_u + 2 \times C_{nbt} \text{ and } C_{BM} = C_u + 2 \times C_{nbt}$$

Where $C_u$ and $C_{nbt}$ were defined above.

This shows that $C_{AM}=C_{BM}$ and the whole array of unit capacitors is well matched.

Figure 11:
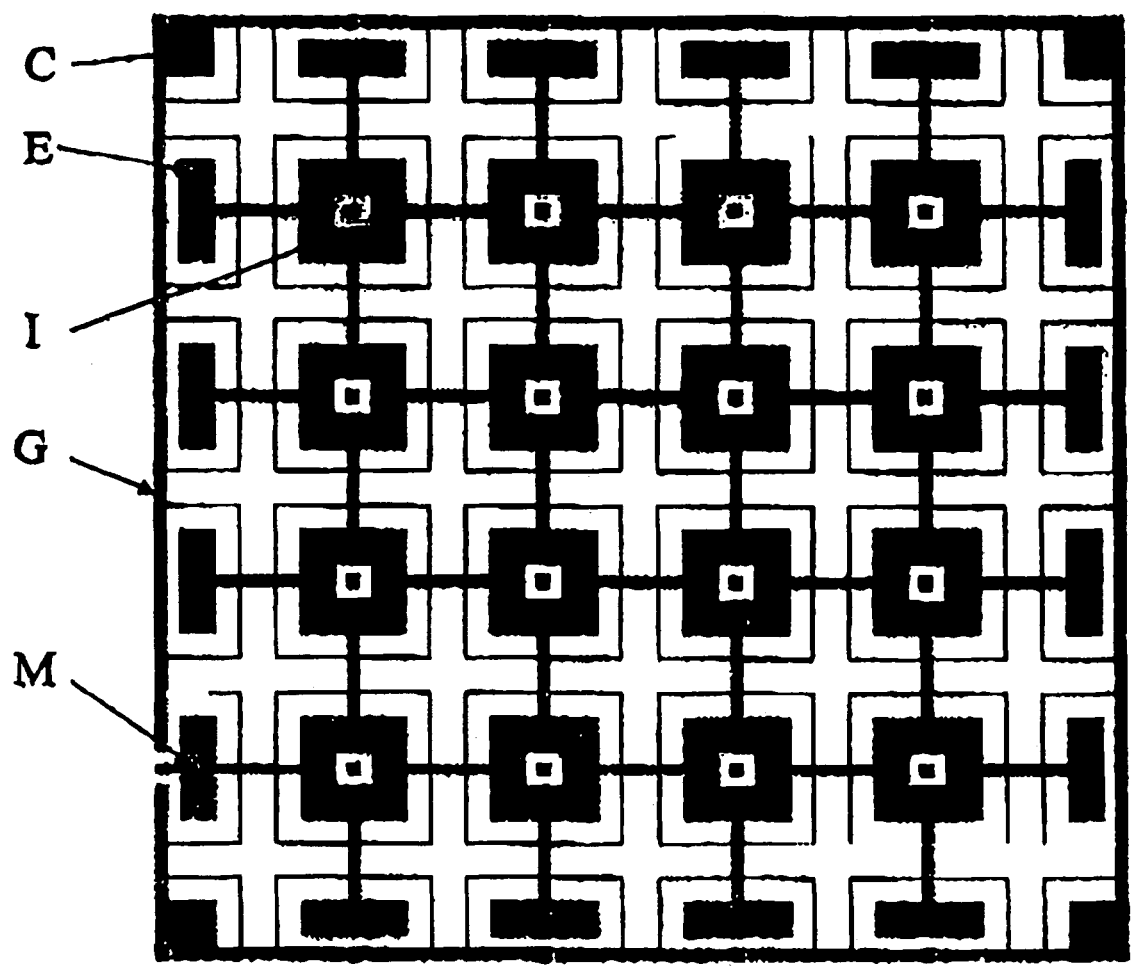
FIG. 11 is an array of 16 matched unit capacitors with 1 common terminal; the array includes the dummy capacitor border built according to this invention.

FIG. 11 shows an array of 16 matched unit capacitors (e.g. one unit capacitor is denoted I) with 1 common top terminal. The edge dummy cells (E) are present at the periphery of the array as described before. This array uses only half size dummy capacitors as described before. The corner dummy capacitors (C) can be built on the same principle as the edge dummy capacitors (i.e. with the middle layer connected to the common terminal of the array. Due to the fact that the capacitance between two neighboring corners is much smaller that the one between two neighboring edges, the good enough solution, as shown in FIG. 11 is to use all three layers of the dummy capacitor tied to G.

FIG. 11 shows also how to extract the top terminal of the capacitor array using the edge cell denoted M. This half of the unit capacitor adds about $C_u/2$ to the parasitic capacitance between the array's top plate and ground.

Figure 12:
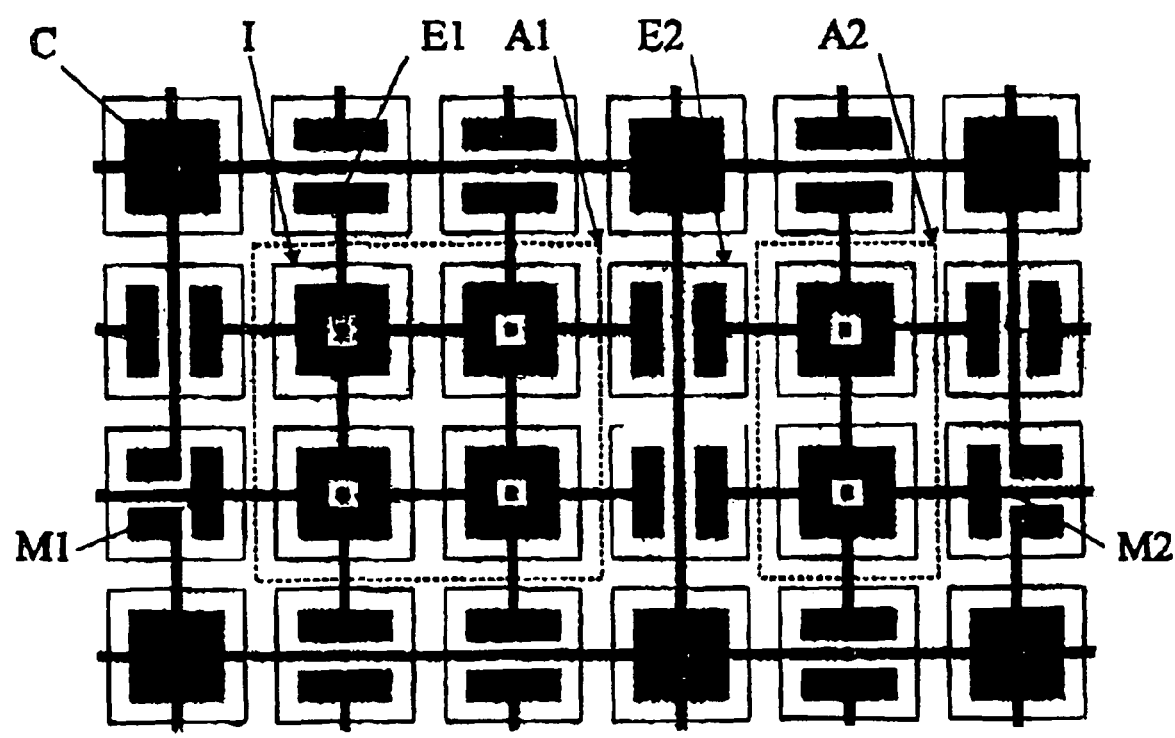
FIG. 12 shows two arrays of matched unit capacitors each array with a common terminal; the array includes the dummy capacitor border built according to this invention.

FIG. 12 shows two arrays (A1 and A2) of matched unit capacitors (e.g. I) each array with a common terminal. The external edge (E1) and corner (C) dummy capacitors are fully drawn (not half as in FIG. 11). The internal border dummy capacitors (e.g. E1) are used to separate the two top plates of the arrays A1 and A2. The M1 and M2 edge capacitors are used to route the top plate of each array.

The principles presented above for ensuring a top terminal layer of the edge and corner cells connected to the array's top terminal can be used to build also non-rectangular arrays or groups of arrays.

What is claimed is:

1. A capacitor comprising:
   a first metal plate formed above a semiconductor substrate;
   a second metal plate formed above the first metal plate, the second metal plate having an opening in a central portion thereof;
   a third metal plate formed above the second metal plate;
   an insulating material between the first, second and third metal plates and on the semiconductor substrate; and
   a conductive member, formed through the insulating material and the opening of the second metal plate, that electrically connects the first and third metal plates.

2. The capacitor of claim 1, further comprising:
   a bottom conductive pattern formed over the semiconductor substrate; and
   a second conductive member, formed through the insulating material, that electrically connects the first metal plate and the bottom conductive pattern.

3. The capacitor of claim 2, wherein the bottom conductive pattern comprises a polysilicon interconnection pattern formed on an oxide layer over the semiconductor substrate.

4. The capacitor of claim 2, wherein the bottom conductive pattern comprises a metal interconnection pattern formed on an oxide layer over the semiconductor substrate.

5. The capacitor of claim 2, wherein the bottom conductive pattern comprises a diffusion pattern formed in the semiconductor substrate.

6. The capacitor of claim 1, wherein each of the first and third metal plates have larger area than an area of the second metal plate.

7. The capacitor of claim 1, wherein the second metal plate is divided into plate sections that are electrically isolated from each other.

8. The capacitor of claim 1, used as a unit capacitor within a capacitor array of plural unit capacitors.

9. The capacitor of claim 8, wherein the second metal plate has conductive branch members extending therefrom that connect the second metal plate to second metal plates of the plural unit capacitors.

10. The capacitor of claim 9, wherein the first, second and third metal plates are rectangular shaped, the second metal plate having respective conductive branch members extending from each side thereof.

11. The capacitor of claim 9, wherein the second metal plate is divided into plate sections, the plate sections being electrically isolated from each other.

12. A capacitor array including a plurality of interconnected unit capacitors, each of the unit capacitors comprising:
   a first metal plate formed above a semiconductor substrate;
   a second metal plate formed above the first metal plate, the second metal plate having an opening in a central portion thereof;
   a third metal plate formed above the second metal plate;
   an insulating material between the first, second and third metal plates and on the semiconductor substrate; and
   a conductive member, formed through the insulating material and the opening of the second metal plate, that electrically connects the first and third metal plates.

13. The capacitor array of claim 12, further comprising:
   a plurality of bottom conductive patterns formed over the semiconductor substrate; and
   a plurality of second conductive members, formed through the insulating material, that electrically connect the first metal plates and the bottom conductive patterns.

14. The capacitor array of claim 13, wherein the bottom conductive patterns comprise polysilicon interconnection patterns formed on oxide layers over the semiconductor substrate.

15. The capacitor array of claim 13, wherein the bottom conductive patterns comprise metal interconnection patterns formed on oxide layers over the semiconductor substrate.

16. The capacitor array of claim 13, wherein the bottom conductive patterns comprise diffusion patterns formed in the semiconductor substrate.

17. The capacitor array of claim 12, wherein each of the first and third metal plates have larger area than an area of the second metal plates.

18. The capacitor array of claim 12, wherein the second metal plates have conductive branch members extending therefrom that connect the second metal plates of the unit capacitors together.

19. The capacitor array of claim 18, wherein the first, second and third metal plates are rectangular shaped, the second metal plates having respective conductive branch members extending from each side thereof.

20. The capacitor array of claim 12, comprising unit capacitors connected at a periphery of the capacitor array as dummy unit capacitors,
   the second metal plates of the dummy unit capacitors being divided into dummy plate sections, so that dummy plate sections of a respective dummy unit capacitor are electrically isolated from other dummy plate sections of the respective dummy unit capacitor.

21. The capacitor array of claim 20, wherein only the dummy plate sections that are directly adjacent and facing the unit capacitors are electrically connected to the second metal plates of corresponding adjacent unit capacitors.

22. The capacitor array of claim 21, wherein the dummy plate sections that are not directly adjacent and facing the unit capacitors are grounded or electrically floating.

23. The capacitor array of claim 21, wherein the second metal plates of the unit capacitors are rectangular shaped and include respective conductive branch members extending from each side thereof, the second metal plates of the corresponding adjacent unit capacitors being electrically connected to the dummy plate sections of the dummy unit capacitors via the conductive branch members.

* * * * *